United States Patent
Zhang et al.

(10) Patent No.: US 10,296,132 B2
(45) Date of Patent: May 21, 2019

(54) METHOD AND DEVICE FOR TESTING ROTATION PERFORMANCE OF TOUCH DISPLAY SCREEN

(71) Applicant: BOE Technology Group Co., Ltd., Beijing (CN)

(72) Inventors: Zhiying Zhang, Beijing (CN); Hangman Lai, Beijing (CN); Zhigang Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 224 days.

(21) Appl. No.: 15/515,846

(22) PCT Filed: Aug. 17, 2016

(86) PCT No.: PCT/CN2016/095674
§ 371 (c)(1),
(2) Date: Mar. 30, 2017

(87) PCT Pub. No.: WO2017/113812
PCT Pub. Date: Jul. 6, 2017

(65) Prior Publication Data
US 2018/0329562 A1    Nov. 15, 2018

(30) Foreign Application Priority Data

Dec. 31, 2015 (CN) .......................... 2015 1 1025726

(51) Int. Cl.
G06F 3/041    (2006.01)
G01R 31/00   (2006.01)
G06F 3/0488  (2013.01)

(52) U.S. Cl.
CPC ........... *G06F 3/0416* (2013.01); *G01R 31/00* (2013.01); *G06F 3/04883* (2013.01);
(Continued)

(58) Field of Classification Search
CPC ...... G06F 3/0416; G06F 3/041; G06F 3/0488; G06F 3/04883; G06F 2203/04103; G06F 2203/04808
See application file for complete search history.

(56) References Cited

U.S. PATENT DOCUMENTS 7,131,211 B2 * 11/2006 Kirstine ................. G01B 5/068
33/552
7,136,076 B2 * 11/2006 Evanicky .................. G01J 3/02
345/600
(Continued)

FOREIGN PATENT DOCUMENTS

CN    202433459 U    9/2012
CN    203204091 U    9/2013
(Continued)

OTHER PUBLICATIONS

Oct. 26, 2016—(WO) International Search Report and Written Opinion Appn PCT/CN2016/095674 with English Tran.

*Primary Examiner* — Vijay Shankar
(74) *Attorney, Agent, or Firm* — Banner & Witcoff, Ltd.

(57) ABSTRACT

A method and a device for testing a rotation performance of a touch display screen are provided. The method comprises: determining at least two test positions in a display region of the touch display screen, the at least two test positions including at least one test position located in a central region of the display region and at least one test position located in an edge region of the display region; and testing a rotation performance corresponding to each test position of the at least two test positions.

17 Claims, 13 Drawing Sheets

(52) U.S. Cl.
CPC ............. *G06F 2203/04103* (2013.01); *G06F 2203/04104* (2013.01); *G06F 2203/04808* (2013.01)

(56) References Cited

U.S. PATENT DOCUMENTS

| | | | |
|---|---|---|---|
| 7,340,843 B2* | 3/2008 | Zhang | G01B 21/22 33/1 BB |
| 7,405,742 B2* | 7/2008 | Evanicky | G09G 3/006 345/204 |
| 7,532,026 B2* | 5/2009 | Huang | H04N 17/02 324/760.01 |
| 2007/0296450 A1 | 12/2007 | Huang et al. | |

FOREIGN PATENT DOCUMENTS

| | | |
|---|---|---|
| CN | 104360811 A | 2/2015 |
| CN | 105425084 A | 3/2016 |
| JP | H11194037 A | 7/1999 |

\* cited by examiner

METHOD AND DEVICE FOR TESTING ROTATION PERFORMANCE OF TOUCH DISPLAY SCREEN

The application is a U.S. National Phase Entry of International Application No. PCT/CN2016/095674 filed on Aug. 17, 2016, designating the United States of America and claiming priority to Chinese Application No. 201511025726.1 filed on Dec. 31, 2015. The present application claims priority to and the benefit of the above-identified applications and the above-identified applications are incorporated by reference herein in their entirety.

TECHNICAL FIELD

Embodiments of the present disclosure relate to a method and a device for testing a rotation performance of a touch display screen.

BACKGROUND

A multi-touch display device needs to be tested on its various aspects of performance before leaving the factory, to ensure product quality; for example, a rotation performance of a touch display screen of the multi-touch display device is tested. The rotation performance refers to a performance that, in the presence of a rotation gesture, the touch display screen of the multi-touch display device is capable of detecting the rotation gesture and making a corresponding image rotate according to the rotation gesture.

For example, the testing on the rotation performance of the touch display screen is performed by simulating two fingers of a user with two cylindrical test bars. On the one hand, two test bars of a same diameter are used, a distance between the two test bars is set, then one test bar is fixed and the other test bar rotates around the fixed test bar, a rotation trace of the other test bar detected by the touch display screen is compared with an ideal trace, a deviation value of the rotation trace from the ideal trace is calculated, and quality of the rotation performance of the touch display screen is determined according to the deviation value. On the other hand, two test bars of a same diameter are used, distances between a test position and the two test bars are set respectively, then the two test bars are subjected to concentric rotation around a point indicated by the test position, rotation traces of the two test bars detected by the touch display screen are compared with ideal traces, a deviation value of the rotation trace from the ideal trace is calculated, and quality of the rotation performance of the touch display screen is determined according to the deviation value. Usually, the larger the deviation value, the worse the rotation performance.

However, as described above, during the rotation performance test is performed, the test position for the test bar to perform testing is usually selected at random; and in practice, test results at different positions on a display region of the touch display screen are different. So, the randomly selected test position may result in a less accurate test result.

SUMMARY

According to embodiments of the disclosure, a method for testing a rotation performance of a touch display screen is provided. The method comprises: determining at least two test positions in a display region of the touch display screen, the at least two test positions including at least one test position located in a central region of the display region and at least one test position located in an edge region of the display region; and testing a rotation performance corresponding to each test position of the at least two test positions.

According to the embodiments of the disclosure, a device for testing a rotation performance of a touch display screen is provided. The device comprises: a determination module, configured to determine at least two test positions in a display region of the touch display screen, the at least two test positions including at least one test position located in a central region of the display region and at least one test position located in an edge region of the display region; and a testing module, configured to test a rotation performance corresponding to each test position of the at least two test positions.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2-1 is a schematic view illustrating different regions of the touch display screen provided by the embodiments of the present disclosure;

FIG. 2-2 is a flowchart view illustrating another method for testing the rotation performance of the touch display screen provided by the embodiments of the present disclosure;

FIG. 2-3 is a schematic view illustrating a central region of a display region provided by the embodiments of the present disclosure;

FIG. 2-4 is a schematic view illustrating an edge region of the display region provided by the embodiments of the present disclosure;

FIG. 2-5 is a schematic view illustrating a transition region of the display region provided by the embodiments of the present disclosure;

FIG. 2-6 is a schematic view illustrating division of the display region provided by the embodiments of the present disclosure;

FIG. 2-7 is a schematic view illustrating a rotation trace of a test bar formed by the method for testing the rotation performance of the touch display screen provided by the embodiments of the present disclosure;

FIG. 2-8 is a schematic view illustrating relative dimensions during testing the rotation performance provided by the embodiments of the present disclosure;

FIG. 2-9 is a schematic view illustrating a process of two test bars rotating around a first test position provided by the embodiments of the present disclosure;

FIG. 2-10 is a schematic view illustrating a method for determining whether a rotation performance corresponding to a test position is qualified or not provided by the embodiments of the present disclosure;

FIG. 3-1 is a flowchart of another method for testing the rotation performance of the touch display screen provided by the embodiments of the present disclosure;

FIG. 3-2 is a schematic view illustrating the test position of the edge region provided by the embodiments of the present disclosure;

FIG. 3-3 is a schematic view illustrating another test position of the edge region provided by the embodiments of the present disclosure;

FIG. 4-1 is a block view of a device for testing the rotation performance of the touch display screen provided by the embodiments of the present disclosure;

FIG. 4-2 is a block view of a determination module provided by the embodiments of the present disclosure;

FIG. 4-3 is a block view of another device for testing the rotation performance of the touch display screen provided by the embodiments of the present disclosure; and FIG. 4-4 is a block view of another determination module provided by the embodiments of the present disclosure.

The above-described drawings have illustrated the specific embodiments of the present disclosure, and a more detailed description will be provided hereinafter. These drawings and textual descriptions are not intended to limit a scope of conception of the present disclosure by any means, but rather are illustrative of the inventive concept for those skilled in the art with reference to specific embodiments.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
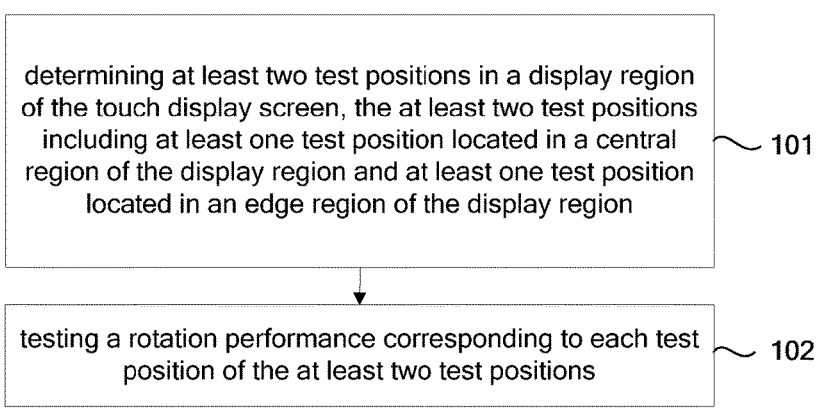
FIG. 1 is a flowchart view illustrating a method for testing a rotation performance of a touch display screen provided by embodiments of the present disclosure.

Embodiments of the present disclosure provide a method for testing a rotation performance of a touch display screen, and as shown in FIG. 1, the method comprises:

Step 101: determining at least two test positions in a display region of the touch display screen, the at least two test positions including at least one test position located in a central region of the display region and at least one test position located in an edge region of the display region.

Step 102: testing a rotation performance corresponding to each test position of the at least two test positions.

For example, the rotation performance refers to a performance that, in the presence of a rotation gesture, the touch display screen is capable of detecting the rotation gesture and making a corresponding image rotate according to the rotation gesture.

Rotation performance of the central region and rotation performance of the edge region of the touch display screen may be greatly different. In the embodiments of the present disclosure, the test positions are determined respectively in the central region and the edge region of the display region, and the rotation performances of the determined test positions are tested, to ensure that regions whose rotation performances differ more greatly of the touch display screen are tested, and thus to enlarge a scope of the test and to improve accuracy of a test result.

In the embodiments of the present disclosure, the determination of the test position is mainly related to a shape of the display region, a diameter of the test bar, and a rotation radius of the test bar during the test, which will be described in the embodiment of the present disclosure with two modes below as an example.

First Mode

Figures 1, 2:
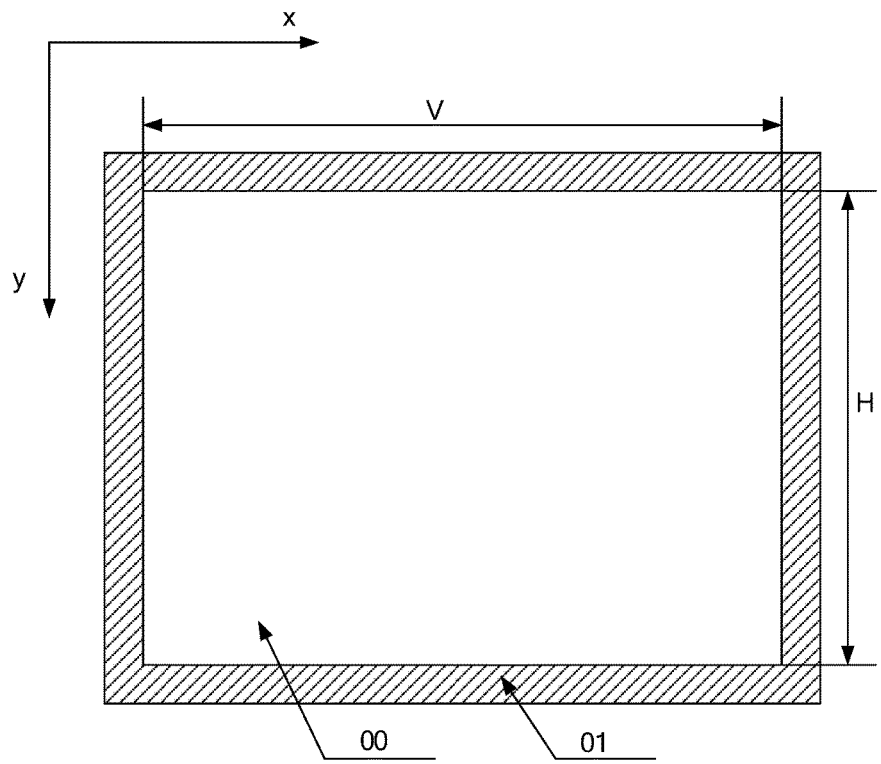
Figure 2:
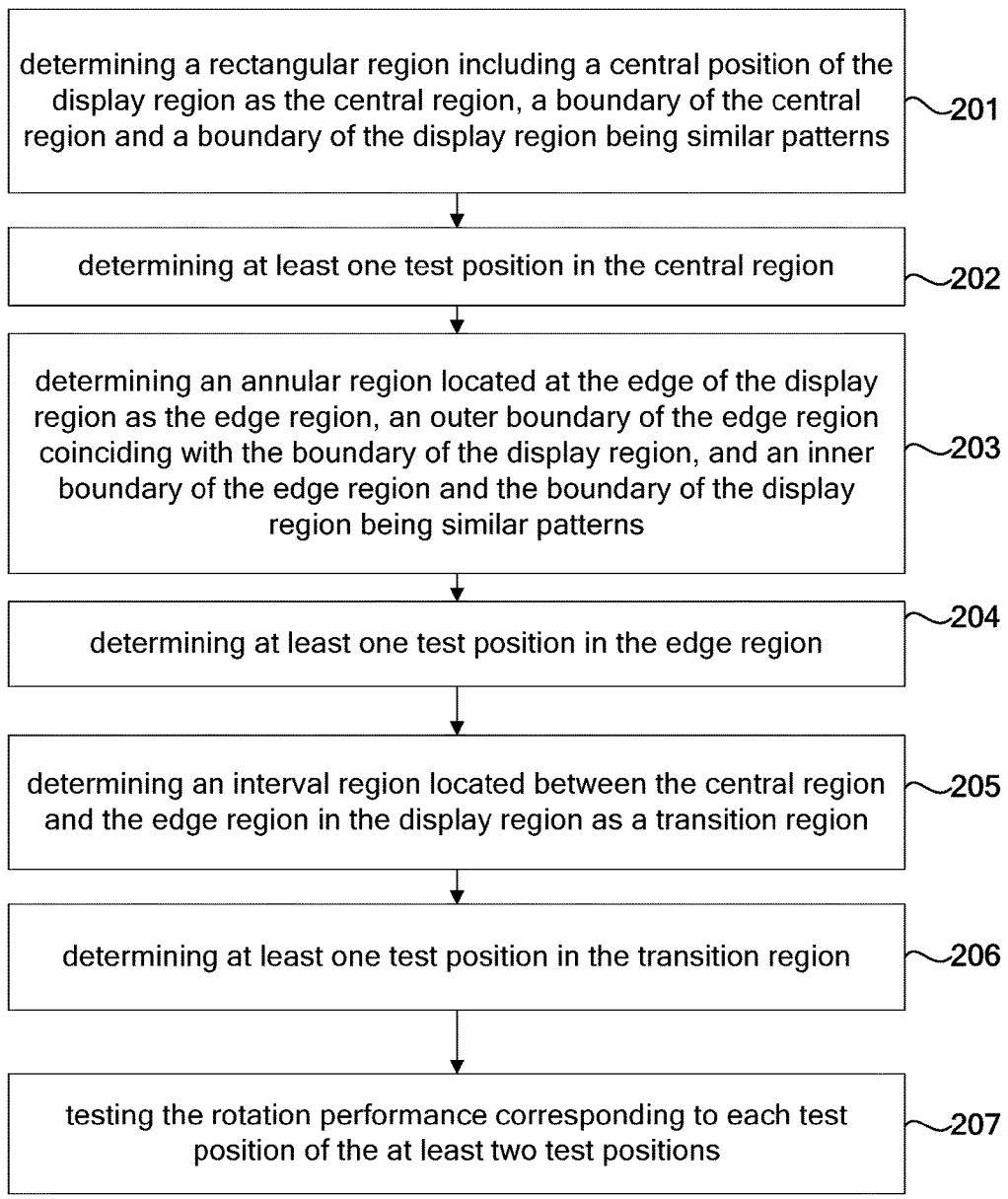

In the first mode, for example, the display region of the touch display screen is a rectangular region, and the display region has a length H and a width V. In the embodiments of the present disclosure, directions of the length and the width of the display region are not limited. For example, a length direction of the display region is parallel to a data line extension direction of the touch display screen, and a width direction of the display region is parallel to a gate line extension direction of the touch display screen. For example, the length direction of the display region is parallel to the gate line extension direction of the touch display screen, and the width direction of the display region is parallel to the data line extension direction of the touch display screen. As shown in FIG. 2-1, the touch display screen includes a display region 00 and a non-display region 01, the non-display region 01 is an annular region surrounding the display region, and the non-display region 01 is used for providing wires and circuits and thus is also referred to as a peripheral wiring region. For example, as shown in FIG. 2-1, the direction of the length H of the display region 00 is parallel to the data line extension direction (a y direction in FIG. 2-1, also referred to as a vertical direction) of the touch display screen, and the direction of the width V of the display region 00 is parallel to the gate line extension direction (an x direction in FIG. 2-1, also referred to as a horizontal direction) of the touch display screen. The embodiments of the present disclosure provide the method for testing the rotation performance of the touch display screen, and as shown in FIG. 2-2, the method comprises:

Step 201: determining a rectangular region including a central position of the display region as the central region, a boundary of the central region and a boundary of the display region being similar patterns.

Figures 2, 3:
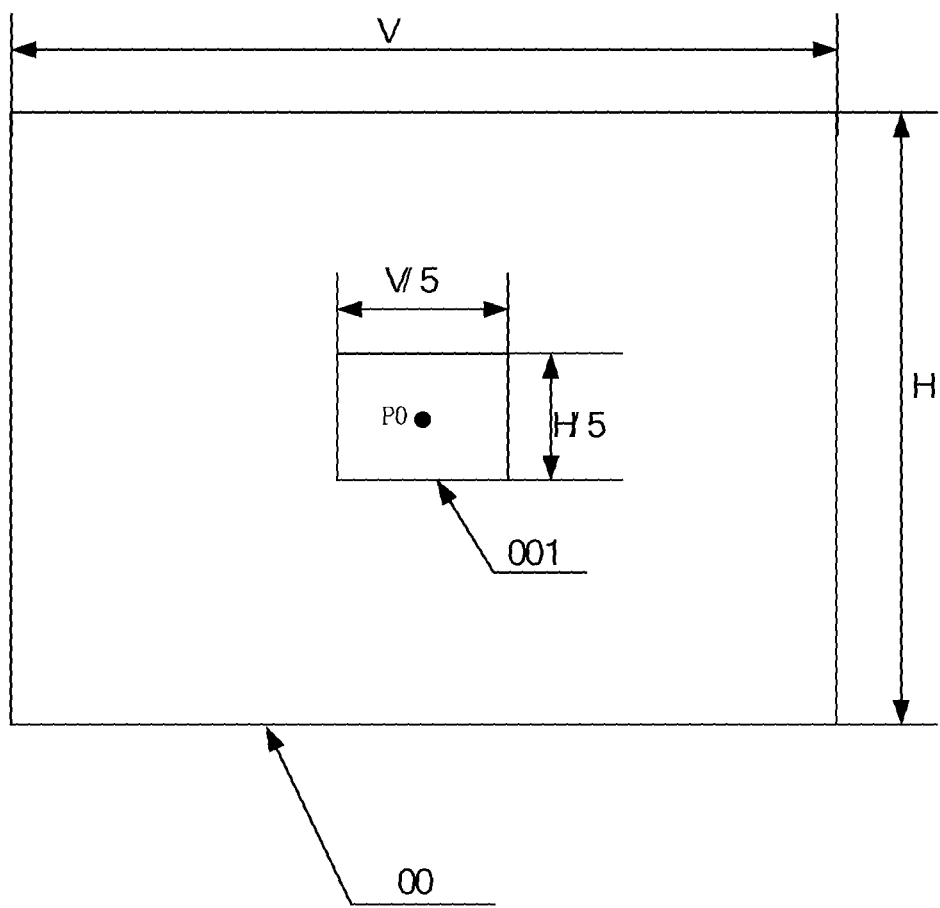

As shown in FIG. 2-3, a rectangular region 001 including a central position P0 of the display region 00 is determined as the central region 001, and the boundary of the central region 001 and the boundary of the display region 00 are similar patterns. A rectangle is a centrosymmetric pattern, whose symmetrical center is an intersection point of two diagonal lines of the rectangle. In the embodiments of the present disclosure, the display region 00 is a rectangular region, and the central position of the display region 00 is a position where the symmetrical center of the display region 00 is located. Similar patterns refer to two patterns whose corresponding angles are equal to each other and corresponding sides are proportional to each other. Exemplarily, in the embodiments of the present disclosure, a ratio of the boundary of the central region 001 to the boundary of the display region 00 is 1/f, that is, the central region 001 has a length of H/f and a width of V/f, where f>2. Optionally, f=5, and FIG. 2-3 is illustrated with f=5 as an example.

Step 202: determining at least one test position in the central region.

Exemplarily, the central position of the display region (i.e., the central position of the central region) is determined as 1 test position in the central region. In this way, an effective test of the rotation performance of the most central position of the display region is ensured.

Step 203: determining an annular region located at the edge of the display region as the edge region, an outer boundary of the edge region coinciding with the boundary of the display region, and an inner boundary of the edge region and the boundary of the display region being similar patterns.

Figures 2, 3, 4:
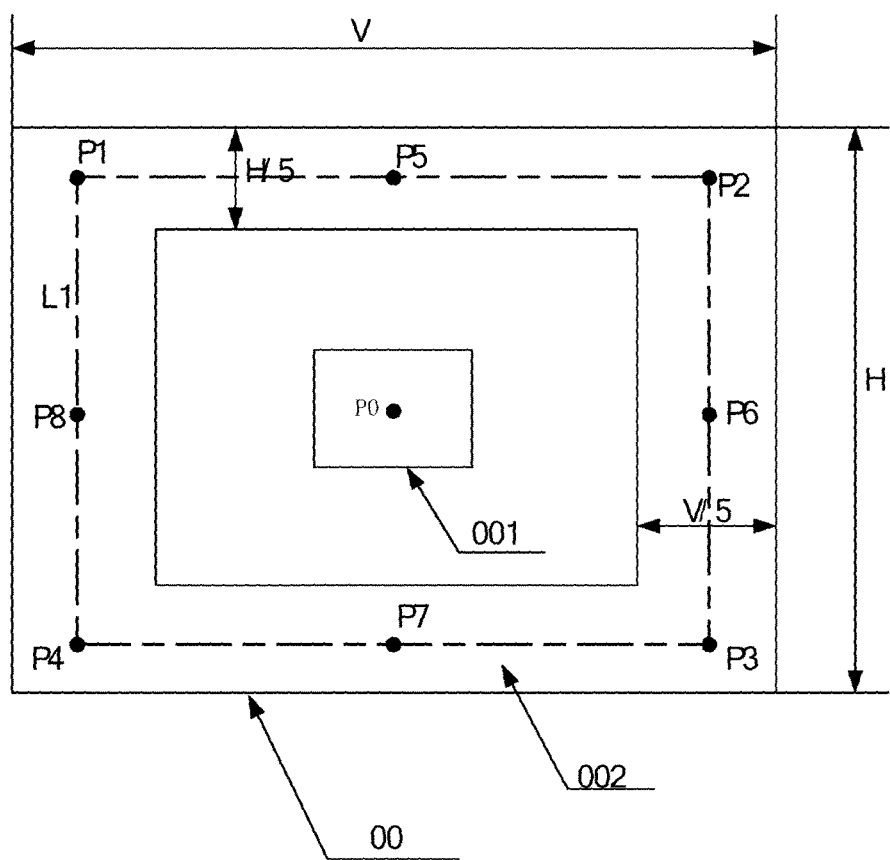
Figures 2, 3, 4, 5:
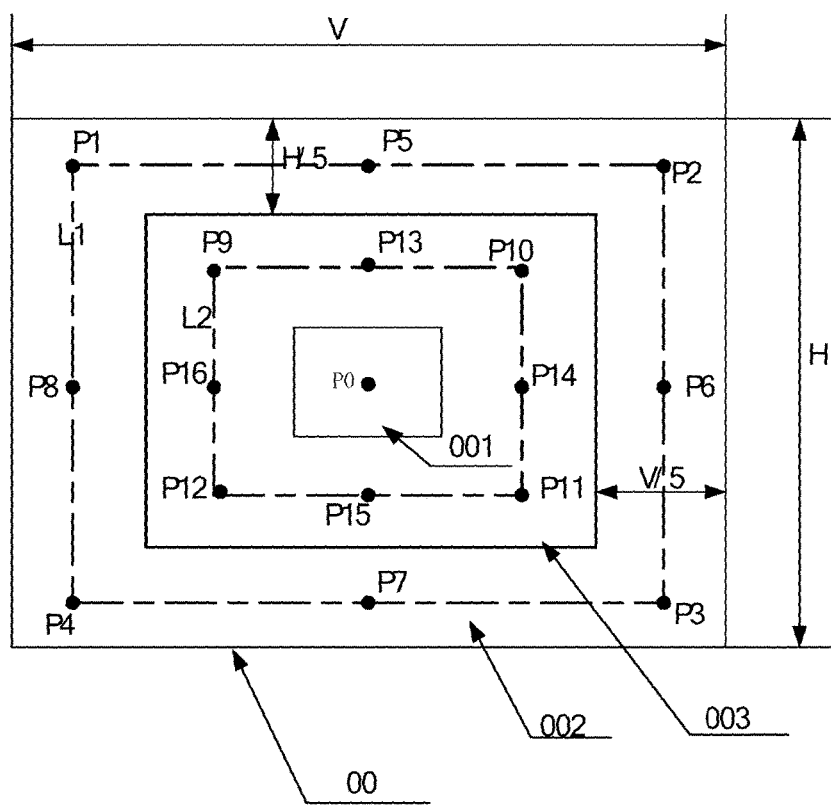
Figures 2, 3, 4, 5, 6:
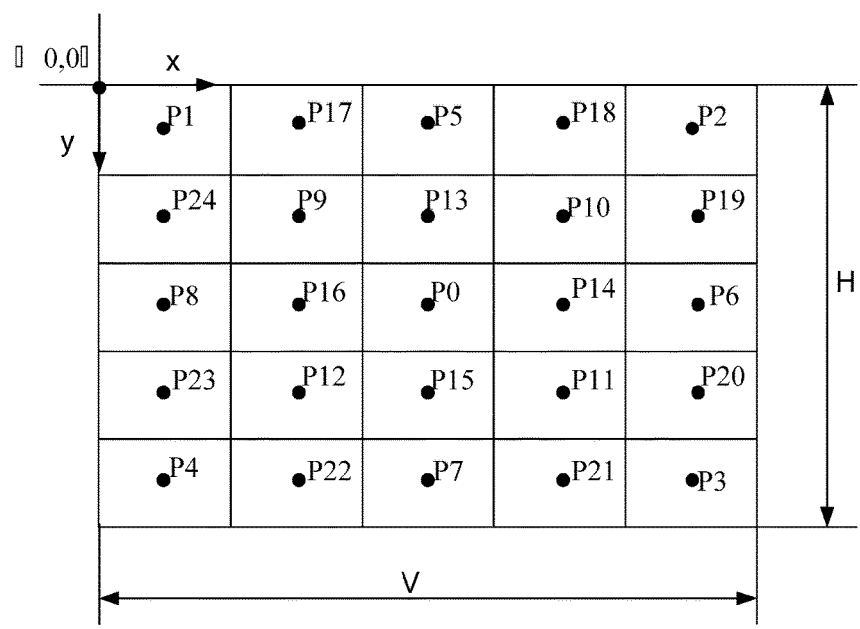
Figures 2, 3, 4, 5, 6, 7:
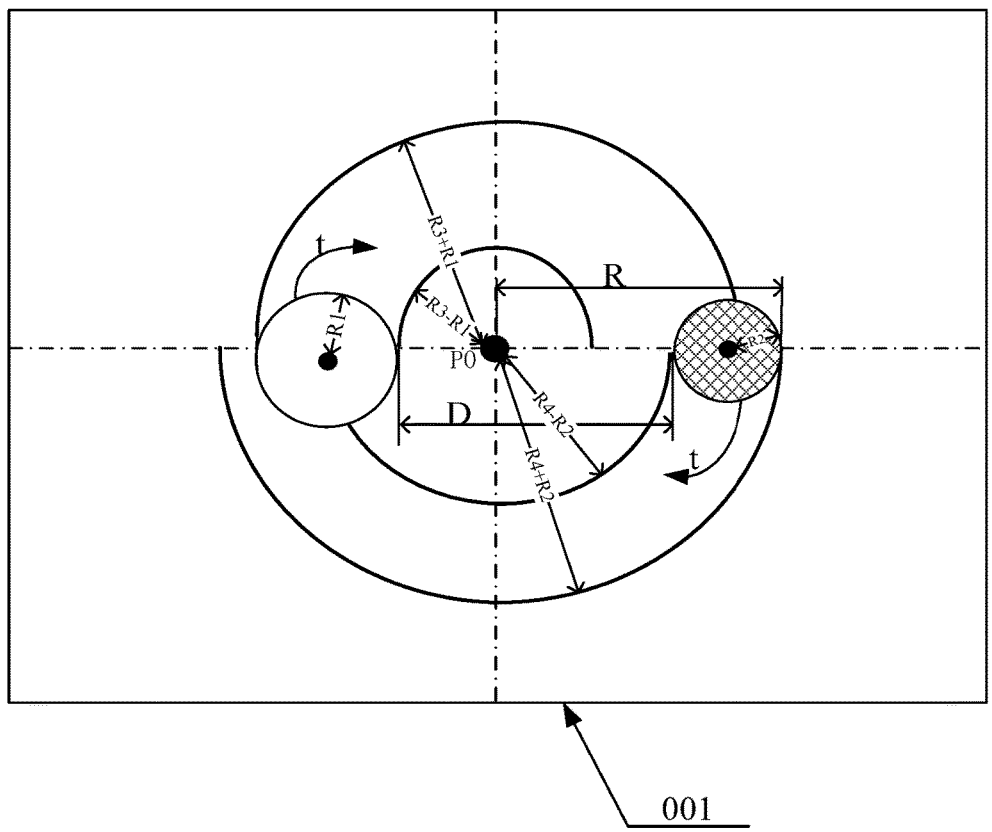
Figures 2, 3, 4, 5, 6, 7, 8:
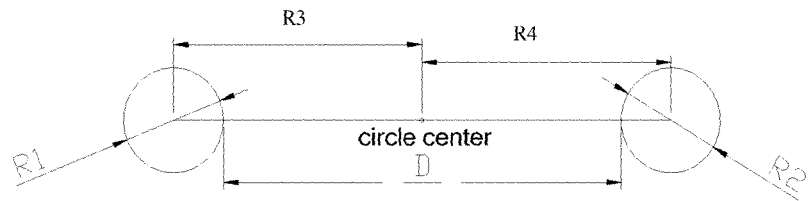
Figures 2, 3, 4, 5, 6, 7, 8, 9:
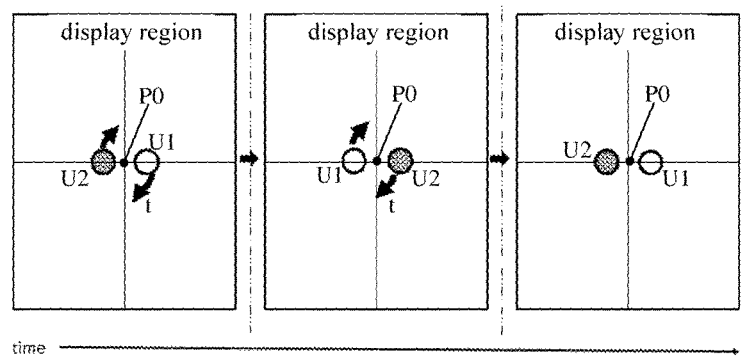
Figures 2, 3, 4, 5, 6, 7, 8, 9, 10:
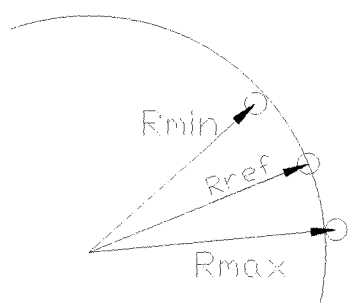
Figures 1, 3:
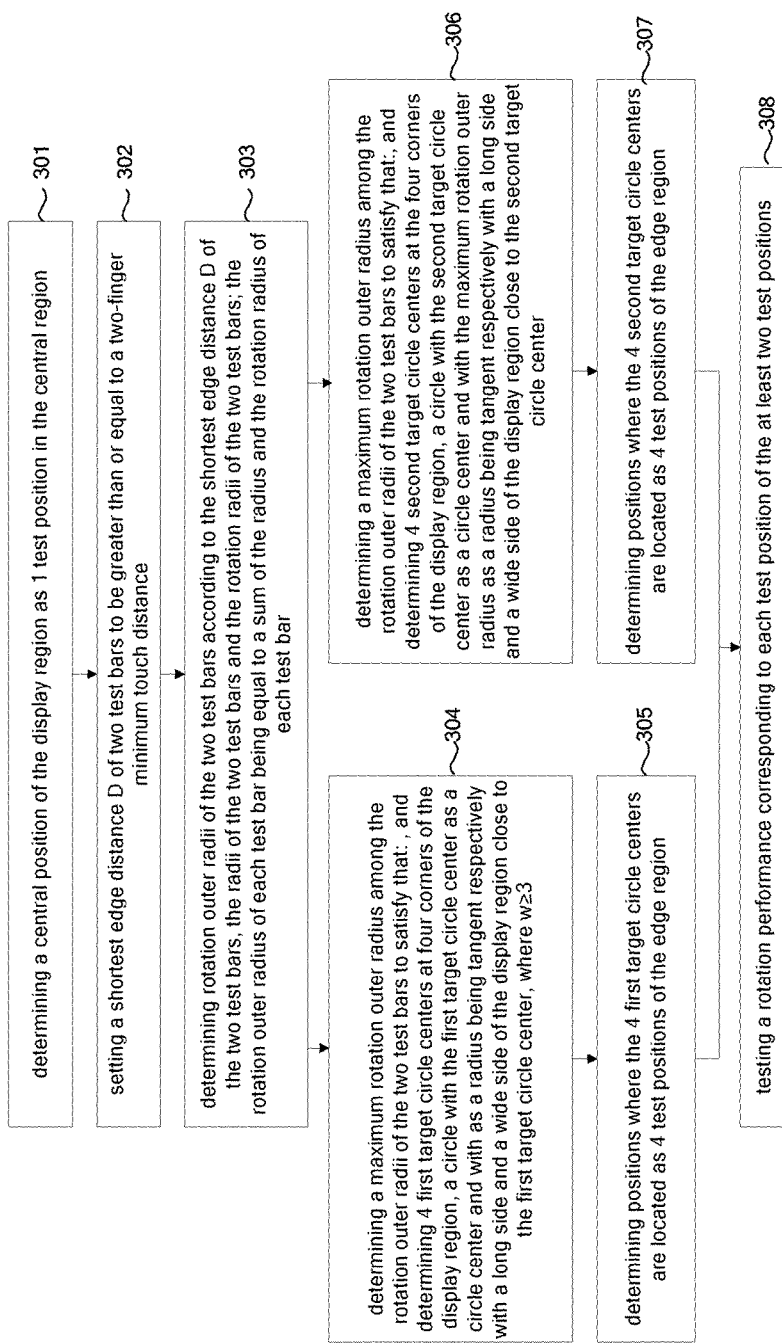
Figures 2, 3:
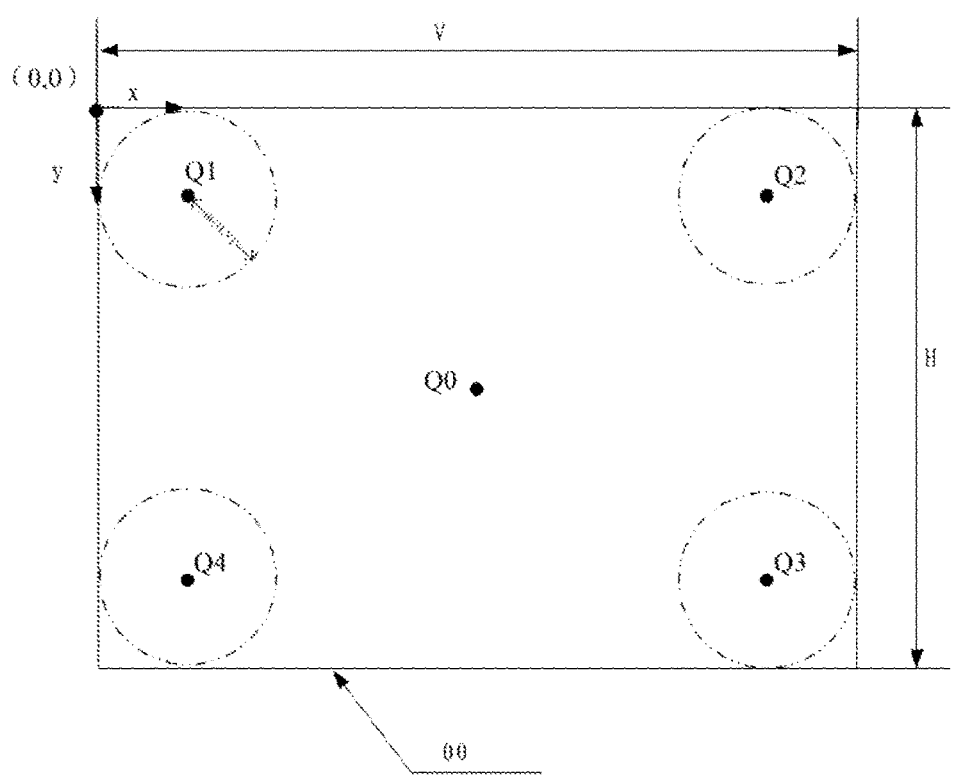
Figure 3:
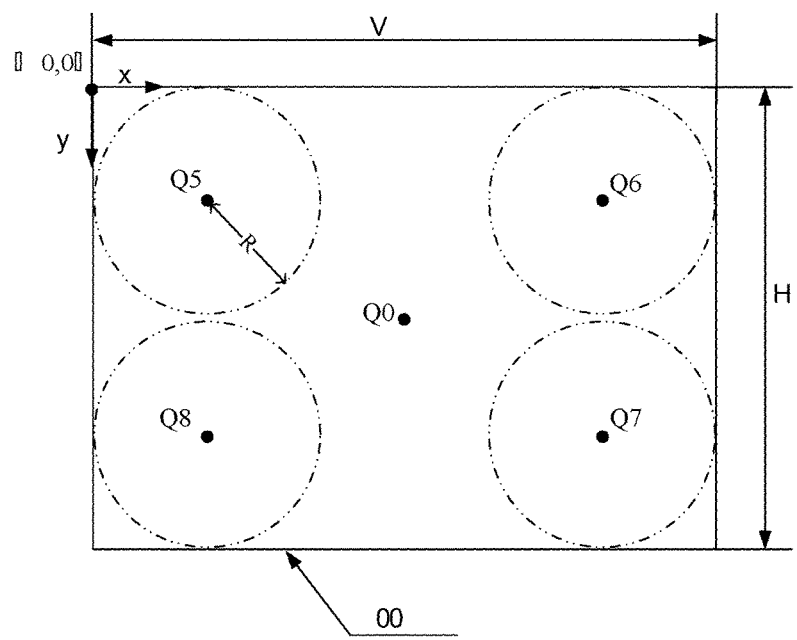
Figures 1, 4:
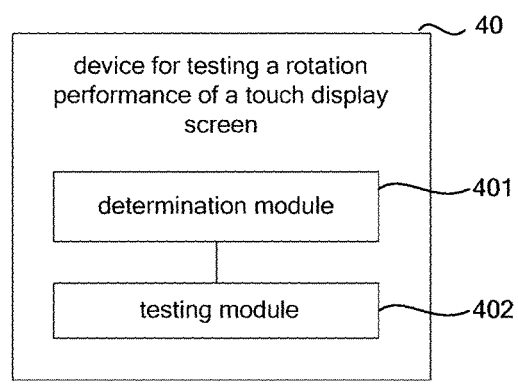
Figures 2, 4:
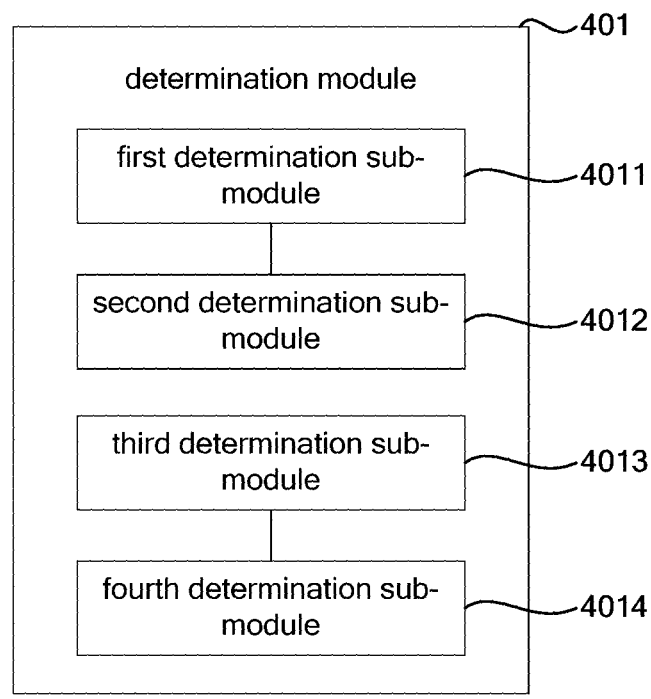
Figures 3, 4:
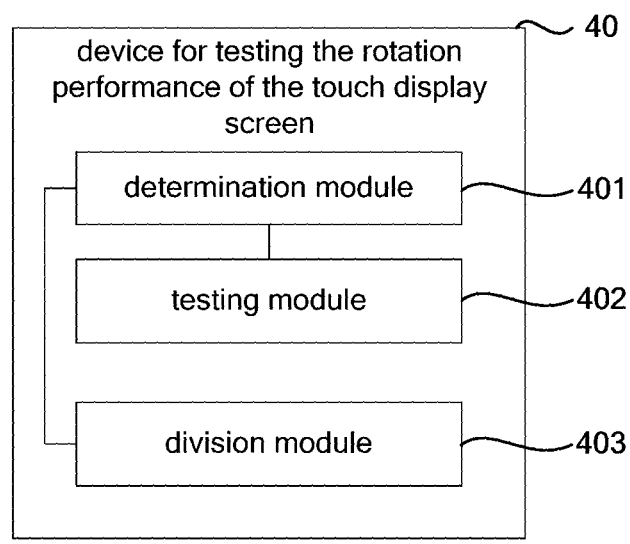
Figure 4:
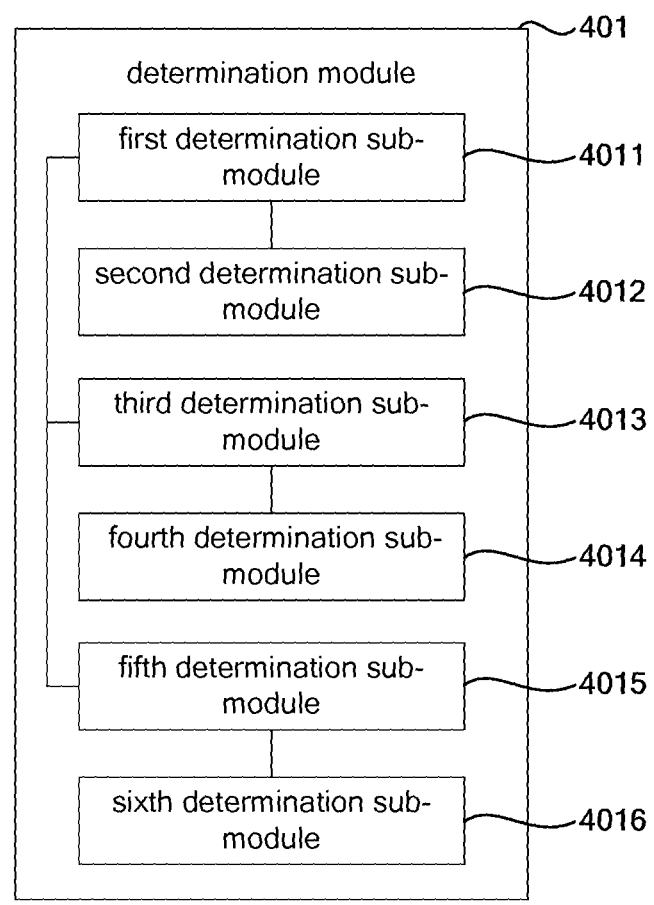

As shown in FIG. 2-4, an annular region located at the edge of the display region 00 is determined as the edge region 002, the outer boundary of the edge region 002 coincides with the boundary of the display region 00, the inner boundary of the edge region 002 and the boundary of the display region are similar patterns, and then the edge region 002 is deemed as a rectangular ring. In the embodiments of the present disclosure, for example, the ratio of the boundary of the central region 001 to the boundary of the display region 00 is 1/f, a ratio of the inner boundary of the edge region 002 to the boundary of the display region 00 is (f−2)/f, and the inner boundary of the edge region 002 has a length of [(f−2)×H]/f and a width of [(f−2)×V]/f, that is, among four striped regions constituting the edge region 002, a width of each of two striped regions is H/f, and a width of each of the other two striped regions is V/f, where f>2, f for example is an integer, such as 5, or for example is a decimal number, such as 4.5. For example, f=5, then as shown in FIG. 2-4, the ratio of the inner boundary of the edge region 002 to the boundary of the display region 00 is 3/5, the inner boundary of the edge region 002 has a length of 3H/5 and a width of 3V/5, that is, among the four striped regions constituting the edge region, the width of each of two striped regions is H/5, and the width of each of the other two striped regions is V/5.

Step 204: determining at least one test position in the edge region.

Exemplarily, as shown in FIG. 2-4, a first rectangular scanning line L1 is determined, the first rectangular scanning line L1 is a closed rectangular line formed by a central axis of each striped region of the four striped regions constituting the edge region 002, and the first rectangular scanning line L1 and the boundary of the display region 00 are similar patterns; and in the case that the ratio of the inner boundary of the edge region 002 to the boundary of the display region 00 is (f−2)/f, a ratio of the first rectangular scanning line L1 to the boundary of the display region 00 is (f−1)/f. For example, f=5, then the ratio of the first rectangular scanning line L1 to the boundary of the display region 00 is 4/5, that is, a rectangle formed by the first rectangular scanning line L1 has a length of 4H/5 and a width of 4V/5; and positions where four vertexes P1, P2, P3 and P4 of the first rectangular scanning line L1 are located are taken as 4 test positions of the edge region.

Further, in order to improve test accuracy and increase test coverage, as shown in FIG. 2-4, positions where midpoints P5, P6, P7 and P8 between every two adjacent vertexes among the four vertexes P1, P2, P3 and P4 of the first rectangular scanning line L1 are located for example taken as another 4 test positions of the edge region.

Further, midpoints between every two adjacent points among the above-described eight points P1 to P8 of the first rectangular scanning line may be taken as another 8 test positions of the edge region (not shown in FIG. 2-4).

Step 205: determining an interval region located between the central region and the edge region in the display region as a transition region.

In general, for example, the display region is constituted by the central region and the edge region. However, in order to further distinguish the test effect of the rotation performance of the central region and the test effect of the rotation performance of the edge region, the display region for example includes the central region, the edge region and the interval region located between the central region and the edge region, and the interval region is determined as the transition region. The rotation performance of the central region and the rotation performance of the edge region usually differ more greatly, and the rotation performance test may not be performed on the interval region located between the central region and the edge region. However, in order to ensure effective coverage of a test scope of the rotation performance, as shown in FIG. 2-5, the interval region located between the central region 001 and the edge region 002 in the display region 00 is determined as the transition region 003, and a test position is determined in the transition region 003 to perform the rotation performance test. The transition region 003 is also an annular region, and an inner boundary of the transition region 003 and the boundary of the display region are similar patterns, and an outer boundary of the transition region 003 and the boundary of the display region are similar patterns. In the embodiments of the present disclosure, in the case that the ratio of the boundary of the central region 001 to the boundary of the display region 00 is 1/f and the ratio of the inner boundary of the edge region 002 to the boundary of the display region 00 is (f−2)/f, a ratio of the inner boundary of the transition region 003 to the boundary of the display region 00 and a ratio of the outer boundary of the transition region 003 to the boundary of the display region 00 are respectively 1/f and (f−2)/f, as shown in FIG. 2-5. For example, f=5, then the ratio of the inner boundary of the transition region 003 to the boundary of the display region 00 and the ratio of the outer boundary of the transition region 003 to the boundary of the display region 00 are respectively 1/5 and 3/5, that is, among the four striped regions constituting the transition region, a width of each of two striped regions is H/5, and a width of each of the other two striped regions is V/5.

Step 206: determining at least one test position in the transition region.

Exemplarily, as shown in FIG. 2-5, a second rectangular scanning line L2 is determined, the second rectangular scanning line L2 is a closed rectangular line formed by a central axis of each striped region of the four striped regions constituting the transition region, the second rectangular scanning line L2 and the boundary of the display region 00 are similar patterns. In the case that the ratio of the inner boundary of the transition region 003 to the boundary of the display region 00 and the ratio of the outer boundary of the transition region 003 to the boundary of the display region 00 are respectively 1/f and (f−2)/f, a ratio of the second rectangular scanning line L2 to the boundary of the display region 00 is (f−3)/f. For example, f=5, then the ratio of the second rectangular scanning line L2 to the boundary of the display region 00 is 2/5, that is, a rectangle formed by the second rectangular scanning line L2 has a length of 2H/5 and a width of 2V/5. Positions where four vertexes P9, P10, P11 and P12 of the second rectangular scanning line L2 are located are taken as 4 test positions of the transition region.

Further, in order to improve test accuracy and increase test coverage, as shown in FIG. 2-5, positions where midpoints P13, P14, P15 and P16 between every two adjacent vertexes among the four vertexes P9, P10, P11 and P12 of the second rectangular scanning line are located are taken as another 4 test positions of the transition region.

Further, midpoints between every two adjacent points among the above-described eight points P9 to P16 of the second rectangular scanning line may be taken as another 8 test positions of the transition region (not shown in FIG. 2-5).

It should be noted that, in the first mode as described above, before step 201, the method comprises a division of the display region; as shown in FIG. 2-6, the display region is divided into n×n rectangular sub-regions, a boundary of each rectangular sub-region and the boundary of the display region are similar patterns, where, n is an odd number greater than 2, exemplarily, n is 3, 5 or 7, and for example, n is 5.

For example, in step 201, the determining the rectangular region including the central position of the display region as the central region includes: determining the rectangular sub-region located at the center of the display region as the central region.

In step 203: the determining the annular region located at the edge of the display region as the edge region includes: determining a region constituted by 4×(n−1) rectangular sub-regions located at the edge of the display region as the edge region, the 4×(n−1) rectangular sub-regions constituting the annular region. Exemplarily, n=5, the region constituted by 16 rectangular sub-regions located at the edge of the display region is determined as the edge region.

Accordingly, in step 204, the determining at least one test position in the edge region includes: determining central positions of the 4 rectangular sub-regions located at four corners of the edge region as 4 test positions P1, P2, P3, and P4 of the edge region.

Further, in order to improve the test accuracy and increase the test coverage, as shown in FIG. 2-6, central positions of other rectangular sub-regions in the edge region are taken as the test positions. For example, central positions P5, P6, P7 and P8 of the rectangular sub-regions located in the middle between every two adjacent rectangular sub-regions among the 4 rectangular sub-regions at the four corners of the edge region are taken as another 4 test positions of the edge region. Further, central positions P17, P18, P19, P20, P21, P22, P23, and P24 of the rectangular sub-regions located in the middle between every two adjacent rectangular sub-regions among the total 8 rectangular sub-regions, including the total 4 rectangular sub-regions located in the middle between every two adjacent rectangular sub-regions among the 4 rectangular sub-regions at the four corners of the edge region, and the total 4 rectangular sub-regions at the four corners of the edge region, are taken as another 8 test positions of the edge region.

In step 206, as shown in FIG. 2-6, central positions of 4 rectangular sub-regions located at the four corners of the transition region for example are determined as 4 test positions P9, P10, P11 and P12 of the transition region.

Further, in order to improve the test accuracy and increase the test coverage, central positions P13, P14, P15, and P16 of rectangular sub-regions located in the middle between every two adjacent rectangular sub-regions among the 4 rectangular sub-regions at the four corners of the transition region for example are taken as another 4 test positions of the transition region.

It should be noted that, from step 201 to step 206, there may be various methods for determining the test position in the central region, the test position in the edge region and the test position in the transition region, which are not limited by the embodiments of the present disclosure. Further, the number of test positions finally determined are at least two, for example, is 5; and in the embodiments of the present disclosure, cases below are taken as an example:

As shown in any one of FIGS. 2-4 to 2-6, 5 test positions are determined to include: P0, P1, P2, P3 and P4;

As shown in FIG. 2-5 or FIG. 2-6, 9 test positions are determined to include: P0, P1, P2, P3, P4, P5, P6, P7 and P8;

As shown in FIG. 2-5 or FIG. 2-6, 13 test positions are determined to include: P0, P1, P2, P3, P4, P5, P6, P7, P8, P9, P10, P11 and P12;

As shown in FIG. 2-6, 25 test positions are determined to include: P0, P1, P2, P3, P4, P5, P6, P7, P8, P9, P10, P11, P12, P13, P14, P15, P16, P17, P18, P19, P20, P21, P22, P23 and P24.

For example, 5 test positions are tested. As shown in FIG. 2-6, for example, n=5, the display region has the length H and the width V, a rectangular coordinate system is established in FIG. 2-6 with an upper left corner of the display region shown in FIG. 2-6 as a coordinate origin (0,0), then the 5 test positions are respectively:

$P0: \left(\frac{V}{2}, \frac{H}{2}\right);$ $P1: \left(\frac{V}{10}, \frac{H}{10}\right);$ $P2: \left(\frac{9V}{10}, \frac{H}{10}\right);$ $P3: \left(\frac{9V}{10}, \frac{9H}{10}\right);$ $P4: \left(\frac{V}{10}, \frac{9H}{10}\right).$ It should be noted that, the origin of the rectangular coordinate system may be other positions of the display region, which is not limited by the embodiments of the present disclosure.

It should be noted that, before step 201, the display region may be divided into n×m rectangular sub-regions, a boundary of each rectangular sub-region and the boundary of the display region are similar patterns, where, n is greater than 2, m is greater than 2, and m is not equal to n; in this case, the determination of the test position can refer to previous descriptions and will not be repeated by the embodiments of the present disclosure.

Step 207: testing the rotation performance corresponding to each test position of the at least two test positions.

In the first mode, the display region includes at least two test regions, as shown in step 201 and step 203, the at least two test regions include the central region and the edge region; and further, as shown in step 205, the at least two test regions further include the transition region. During the test of the rotation performance is being performed, a rotation radius of the test bar is required to satisfy that: an ideal trace (the ideal trace is a theoretical trace obtained by calculating according to the rotation radius of the test bar, the radius of the test bar, and the test position around which the rotation is performed) of the test bar obtained by rotation with a point indicated by a first test position as a circle center is within the test region where the first test position is located. In this way, on the one hand, it is ensured that the rotation trace does not exceed a scope of the display region; and on the other hand, it is ensured that rotation traces of different test regions do not interfere with each other, so as to effectively improve the test accuracy. For example, the first test position is any test position of the at least two test positions.

For example, the central region has the length of H/f and the width of V/f; and among the four striped regions constituting the edge region, the width of each of two striped regions is H/f, and the width of each of the other two striped regions is V/f, where f>2. When f=5, the central region has the length of H/5 and the width of V/5; and among the four striped regions constituting the edge region, the width of each of two striped regions is H/5, and the width of each of the other two striped regions is V/5. The testing the rotation performance corresponding to each test position of the at least two test positions for example comprises:

Step A1: setting a shortest edge distance D of two test bars.

The shortest edge distance of two test bars refers to a shortest distance between edges of the two test bars in the case that axes of the two test bars are perpendicular to a screen surface of the touch display screen, and the shortest edge distance is set to be greater than or equal to a two-finger minimum touch distance. The two-finger minimum touch distance is also referred to as a two-finger separation distance, which is a minimum distance between two fingers in the case that both of the two fingers are capable of being detected by the touch display screen; in the case that the distance between the two fingers is less than or equal to the two-finger minimum touch distance, the touch display screen detects the two fingers as one finger. Therefore, in the case that the shortest edge distance of the two test bars is less than the two-finger minimum touch distance, the touch display screen detects the two test bars as one test bar; in order to ensure effectiveness of the test, the shortest edge distance of the two test bars needs to be greater than or equal to the two-finger minimum touch distance. Further, for example, the shortest edge distance of the two test bars is greater than the two-finger minimum touch distance.

Step A2: coaxially rotating in a same rotation direction the two test bars respectively located on both sides of the first test position, with the point indicated by the first test position as the circle center, a maximum rotation outer radius R among rotation outer radii of the two test bars satisfying that:

$$R \le \frac{\min[H, V]}{2f}.$$

The coaxially rotating in the same rotation direction means that at any moment during the rotation, circle centers of the bottom surfaces of the two test bars which are in contact with the touch display screen are collinear with the point indicated by the first test position, and rotation directions of the two test bars are the same.

For example, for each of the two test bars, the rotation outer radius of the test bar is equal to a sum of a radius of the test bar and the rotation radius of the test bar, and min[H,V] represents a minimum value of H and V. In the embodiments of the present disclosure, for example, R1 and R2 are respectively the radii of the two test bars and R3 and R4 are respectively the rotation radii of the two test bars, then R1+R2+D is a distance between circle centers of the bottom surfaces of the two test bars which are in contact with the touch display screen. R1 and R2 may be equal or unequal to each other, and R3 and R4 may be equal or unequal to each other. In the case that R1 and R2 are equal to each other and R3 and R4 are equal to each other, the maximum rotation outer radius $$R = R1 + \frac{D}{2} = R2 + \frac{D}{2}.$$

R1 and R2 are respectively the radii of the two test bars, and R3 and R4 are respectively the rotation radii of the two test bars. In the case that R1 and R2 are unequal to each other, R1 and R2 may be set during the test according to a normal shape of a finger of a user. Exemplarily, it is assumed that most users usually use an index finger and a middle finger of the right hand to perform rotation operation, an average radius of the index finger of the right hand is 4 mm (millimeter), and an average radius of the middle finger of the right hand is 5 mm, then it is set that R1=4 mm and R2=5 mm. In the case that the radii of the two test bars are unequal to each other, a test scene is more approximate to an actual use scene, and the test result is more accurate.

FIG. 2-7 is illustrated with the first test position being P0 as an example; and for a method for testing the rotation performance of other test positions, the method for testing the rotation performance of the test position P0 may be referred to. In the embodiments of the present disclosure, at the beginning of the test, the two test bars for example are respectively located on both sides of the first test position, and the circle centers of the bottom surfaces of the two test bars which are in contact with the touch display screen are collinear with the point indicated by the first test position; then the two test bars are coaxially rotated in the same rotation direction, and the maximum rotation outer radius R among the rotation outer radii of the two test bars satisfies:

$$R \le \frac{\min[H, V]}{2f};$$

optionally, either of the two test bars is rotated by 360° around the point indicated by the first test position. For example, f=5, then $$R \le \frac{\min[H, V]}{10}.$$

The rotation radius of the test bar according to the embodiments of the present disclosure refers to a distance from the axis of the test bar (i.e., the circle center of the bottom surface of the test bar) to the test position. For example, rotation directions of the two test bars are both a clockwise direction t, the two test bars are rotated by 360° in the clockwise direction t respectively, and ideal traces formed by the rotations of the two test bars are two circular rings with P0 as the circle center, and FIG. 2-7 is illustrated with the traces of the two test bars being respectively rotated by 180° M the clockwise direction t as an example. As shown in FIG. 2-7 and FIG. 2-8, a circular ring corresponding to the test bar with the radius of R1 and the rotation radius of R3 has the inner radius of R3-R1 and the outer radius of R3+R1; a circular ring corresponding to the test bar with the radius of R2 and the rotation radius of R4 has the inner radius of R4-R2 and the outer radius of R4+R2; and in FIG. 2-7, it is assumed that R4+R2>R3+R1, then the maximum rotation outer radius R=R4+R2. In this way, it can be ensured that the ideal trace obtained by rotation with the test position P0 as the center of the circle is within the central region where the test position P0 is located.

Exemplarily, FIG. 2-9 is a schematic view illustrating a process of two test bars U1 and U2 rotating around the first test position P0; as shown in FIG. 2-9, at an initial moment of rotation, the two test bars U1 and U2 are respectively located on both sides of the first test position P0, then the two test bars U1 and U2 are rotated by 360° in the clockwise direction t, and at an end moment of rotation, the two test bars U1 and U2 are respectively located on both sides of the first test position P0.

Step A3: obtaining a rotation trace acquired by the touch display screen.

Step A4: determining whether the rotation performance corresponding to the first test position is qualified or not according to the rotation trace.

After the rotation of the two test bars, the rotation traces of the two test bars and coordinate values of respective points on the rotation trace are recorded, a deviation value between the coordinate value on the rotation trace and the corresponding coordinate value on the ideal trace is calculated, and quality of the rotation performance of the touch display screen is determined according to the deviation value. The embodiments of the present disclosure is illustrated with a procedure below as an example: as shown in FIG. 2-10, for example, a radius (including the inner radius or the outer radius) of the rotation trace of the test bar is within [Rmin, Rmax], and the radius (including the inner radius or the outer radius) of the corresponding ideal trace of the test bar is Rref, then a maximum deviation value between the radius of the rotation trace and the radius of the ideal trace is S:

$$S=\max(|Rref-Rmax|,|Rref-Rmin|).$$

The maximum deviation values of the two test bars are compared with a preset deviation threshold value. In the case that the maximum deviation values of the two test bars both less than the preset deviation threshold value, it is determined that the rotation performance of the touch display screen corresponding to the first test position is qualified.

In the case that the maximum deviation value of either test bar is greater than or equal to the preset deviation threshold value, it is determined that the rotation performance of the touch display screen corresponding to the first test position is unqualified.

For example, in some applications, a shape of the display region is a circle, exemplarily, with reference to the above-described step 201, a circular region including the central position of the display region is determined as the central region, and a boundary of the central region and the boundary of the display region are concentric. With reference to the above-described step 203, for example, an annular region located at the edge of the display region is determined as the edge region, an outer boundary of the annular region coincides with the boundary of the display region, and an inner boundary and the outer boundary of annular region are respectively concentric with the boundary of the display region. For other steps such as the step of determining the test position and the step of testing the rotation performance, the corresponding steps of the above-described first mode may be referred to; any modifications, equivalent alternations and improvements without departing from the spirit and principle of the present disclosure shall be included within the protection scope thereof. Therefore, this is not limited by the embodiments of the present disclosure.

The rotation performances of the central region and of the edge region of the touch display screen may be greatly different. In the embodiments of the present disclosure, the test positions are determined respectively in the central region and the edge region of the display region, and rotation performances of the determined test positions are tested, to ensure that regions whose rotation performances differ more greatly of the touch display screen are tested, and thus to enlarge a coverage scope of the test and to improve accuracy of a test result.

Second Mode

In the second mode, for example, the display region is a rectangular region, and the display region has a length H and a width V. The embodiments of the present disclosure provide a method for testing a rotation performance of a touch display screen, and as shown in FIG. 3-1, the method comprises:

Step 301: determining a central position of the display region as 1 test position in the central region.

In the second mode, a shape of the central region is not limited, and the central region at least includes the central position of the display region.

Step 302: setting a shortest edge distance D of two test bars to be greater than or equal to a two-finger minimum touch distance.

For step 302, step A1 in the above-described embodiments may be referred to, which will not be repeated in the embodiments of the present disclosure.

Step 303: determining rotation outer radii of the two test bars according to the shortest edge distance D of the two test bars, the radii of the two test bars and the rotation radii of the two test bars; the rotation outer radius of each test bar being equal to a sum of the radius and the rotation radius of each test bar.

As shown in FIG. 2-8, for example, the radii of the two test bars are respectively R1 and R2, the rotation radii of the two test bars are respectively R3 and R4, then R3>R1, R4>R2, and R3+R4=D+R1+R2. For example, the rotation radii of the two test bars are equal to each other, then $$R3 = R4 = \frac{D+R1+R2}{2},$$

and the rotation outer radii of the two test bars are respectively $$\frac{D+R1+R2}{2}+R1 \text{ and } \frac{D+R1+R2}{2}+R2.$$

In the case that the rotation radii of the two test bars are unequal to each other, the rotation outer radii of the two test bars are respectively R1+R3 and R2+R4.

Step 304: determining a maximum rotation outer radius among the rotation outer radii of the two test bars to satisfy that:

$$R \leq \frac{\min[H, V]}{w},$$

and determining 4 first target circle centers at four corners of the display region, a circle with the first target circle center as a circle center and with $$\frac{\min[H, V]}{w}$$

as a radius being tangent respectively with a long side and a wide side of the display region close to the first target circle center, where w≥3, and min[H,V] representing a minimum value between H and V.

As shown in FIG. 3-2, the 4 first target circle centers Q1, Q2, Q3 and Q4 are determined at the four corners of the display region, the circle with any one point among Q1, Q2, Q3 and Q4 as the circle center and with $$\frac{\min[H, V]}{w}$$

as the radius is tangent with the long side and the wide side of the display region, i.e., a distance between each point among the 4 first target circle centers Q1, Q2, Q3 and Q4 and the corresponding two sides of the display region is $$\frac{\min[H, V]}{w}.$$

It should be noted that, w for example is an integer or is a decimal number, for example, w=5.

Step 305: determining positions where the 4 first target circle centers are located as 4 test positions of the edge region.

A rectangular coordinate system is established in FIG. 3-2 with an upper left corner of the display region shown in FIG. 3-2 as a coordinate origin (0,0), then the 5 test positions obtained by step 301 and step 305 are respectively:

$$\left(\frac{V}{2}, \frac{H}{2}\right); \quad Q0$$

$$\left(\frac{\min[H, V]}{w}, \frac{\min[H, V]}{w}\right); \quad Q1$$

$$\left(V - \frac{\min[H, V]}{w}, \frac{\min[H, V]}{w}\right); \quad Q2$$

$$\left(V - \frac{\min[H, V]}{w}, H - \frac{\min[H, V]}{w}\right); \quad Q3$$

$$\left(\frac{\min[H, V]}{w}, H - \frac{\min[H, V]}{w}\right). \quad Q4$$

Step 306: determining a maximum rotation outer radius among the rotation outer radii of the two test bars to satisfy that:

$$\frac{\min[H, V]}{w} < R \le \frac{\min[H, V]}{2},$$

and determining 4 second target circle centers at the four corners of the display region, a circle with the second target circle center as a circle center and with the maximum rotation outer radius as a radius being tangent respectively with a long side and a wide side of the display region close to the second target circle center.

As shown in FIG. 3-3, the 4 second target circle centers Q5, Q6, Q7 and Q8 are determined at the four corners of the display region, the circle with any one point among Q5, Q6, Q7 and Q8 as the circle center and with R as the radius is tangent respectively with the long side and the wide side of the display region, i.e., a distance between each point among the 4 second target circle centers Q5, Q6, Q7 and Q8 and the corresponding two sides of the display region is R.

Step 307: determining positions where the 4 second target circle centers are located as 4 test positions of the edge region.

A rectangular coordinate system is established in FIG. 3-3 with an upper left corner of the display region shown in FIG. 3-3 as a coordinate origin (0,0), then the 5 test positions obtained by step 301 and step 307 are respectively:

$$\left(\frac{V}{2}, \frac{H}{2}\right); \quad Q0$$

$$(R, R); \quad Q5$$

$$(V-R, R); \quad Q6$$

$$(V-R, H-R); \quad Q7$$

$$(R, H-R). \quad Q8$$

The test positions determined by using step 301 to step 307 can ensure that the rotation trace does not exceed the scope of the display region. The rotation performance test is performed by using the first target circle center or the second target circle center, which can ensure that the rotation trace is as close as possible to the boundary of the display region, so as to effectively test the rotation performance at the edge of the display region.

Step 308: testing a rotation performance corresponding to each test position of the at least two test positions.

For example, since 1 test position is determined in step 301 and 4 test positions are determined in step 305 or step 307, the at least two test positions include 5 test positions, then the testing the rotation performance corresponding to each test position of the at least two test positions includes:

Step B1: coaxially rotating in a same rotation direction the two test bars respectively located on both sides of a first test position with the point indicated by the first test position as a circle center, the first test position being any test position in the at least two test positions.

In the embodiments of the present disclosure, the first test position is any test position in the above-described 5 test positions.

For example, the coaxially rotating in the same rotation direction means that at any moment during a rotation procedure, circle centers of bottom surfaces of the two test bars which are in contact with the touch display screen are collinear with the point indicated by the first test position, and rotation directions of the two test bars are the same.

Step B3: obtaining a rotation trace acquired by the touch display screen.

Step B4: determining whether the rotation performance corresponding to the first test position is qualified or not according to the rotation trace.

For step B4, step A4 in the above-described embodiments may be referred to, which will not be repeated by the embodiments of the present disclosure.

As described above, rotation performances of the central region and of the edge region of the touch display screen may be greatly different. In the embodiments of the present disclosure, the test positions are determined respectively in the central region and the edge region of the display region, and rotation performances of the determined test positions are tested, to ensure that regions whose rotation performances differ more greatly of the touch display screen are tested, and thus to enlarge a coverage scope of the test and to improve accuracy of a test result.

It should be noted that, the sequence of the steps comprised in the method for testing the rotation performance provided by the embodiments of the present disclosure may be properly adjusted, the steps may be correspondingly increased or reduced according to situations, varied methods easily conceived by those skilled in the art in the technical scope of the present disclosure should fall within the protection scope of the present disclosure and thus are not repeated herein. In the embodiments of the present disclosure, the position refers to the coordinate position, and the point indicated by the position refers to the point corresponding to the position coordinate; and therefore, the position and the point may be represented by a same identifier.

The determination of the test position is mainly related to the shape of the display region, the diameter of the test bar, and the rotation radius of the test bar during the test; during the rotation performance test is being performed, as shown in the first mode, the test region is determined firstly, then the rotation radii of the two test bars are adjusted according to the test position in the test region, for the specific procedure, step 201 to step 207 may be referred to; as shown in the second mode, the shortest edge distance D of the two test bars and the radii and the rotation radii of the two test bars are set firstly, accordingly, the maximum rotation outer radius is determined, and then the test position in the test region is determined according to the maximum rotation outer radius, for the specific procedure, step 301 to step 308 may be referred to.

In practical application, the first mode and the second mode as described above may be used in combination or in cross-reference, which will not be repeated by the embodiment of the present disclosure.

The embodiments of the present disclosure provide a device 40 for testing a rotation performance of a touch display screen. For example, the touch display screen comprises: a liquid crystal panel, E-paper, an OLED panel, a mobile phone, a tablet personal computer, a television, a monitor, a laptop, a digital photo frame, a navigator and any other product or component having a display function. As shown in FIG. 4-1, the device 40 comprises:

A determination module 401, configured to determine at least two test positions in a display region of the touch display screen, the at least two test positions including at least one test position located in a central region of the display region and at least one test position located in an edge region of the display region;

A testing module 402, configured to test a rotation performance corresponding to each test position of the at least two test positions.

Rotation performance of the central region and rotation performance of the edge region of the touch display screen may be greatly different. In the embodiments of the present disclosure, the determination module determines test positions respectively in the central region and the edge region of the display region, and the testing module tests rotation performances of the determined test positions, to ensure that regions whose rotation performances differ more greatly of the touch display screen are tested, and thus to enlarge a coverage scope of the test and to improve accuracy of a test result.

For example, the display region is a rectangular region, and the display region has a length H and a width V, and as shown in FIG. 4-2, the determination module 401, includes:

A first determination sub-module 4011, configured to determine a rectangular region including a central position of the display region as the central region, a boundary of the central region and a boundary of the display region being similar patterns;

A second determination sub-module 4012, configured to determine at least one test position in the central region.

A third determination sub-module 4013, configured to determine an annular region located at the edge of the display region as the edge region, an outer boundary of the edge region coinciding with the boundary of the display region, an inner boundary of the edge region and the boundary of the display region being similar patterns;

A fourth determination sub-module 4014, configured to determine at least one test position in the edge region.

For example, the second determination sub-module 4012 is configured to: determine the central position of the display region as 1 test position in the central region.

For example, the fourth determination sub-module 4014 is configured to: determine a first rectangular scanning line, the first rectangular scanning line being a closed rectangular line formed by a central axis of each striped region of the four striped regions constituting the edge region; take positions where four vertexes of the first rectangular scanning line are located as 4 test positions of the edge region.

For example, the fourth determination sub-module 4014 is further configured to: take positions where midpoints between every two adjacent vertexes among the four vertexes of the first rectangular scanning line are located as another 4 test positions of the edge region.

For example, as shown in FIG. 4-3, the device 40 further comprises: a division module 403, configured to divide the display region into n×n rectangular sub-regions, a boundary of each of the rectangular sub-regions and the boundary of the display region being similar patterns, where, n is an odd number greater than 2.

Accordingly, the first determination sub-module 4011 is configured to: determine a region constituted by a rectangular sub-region located at the center of the display region as the central region;

The third determination sub-module 4013 is configured to: determine a region constituted by 4×(n−1) rectangular sub-regions located at the edge of the display region as the edge region, the 4×(n−1) rectangular sub-regions constituting an annular region.

For example, the fourth determination sub-module 4014, is configured to: determine central positions of the 4 rectangular sub-regions located at four corners of the edge region as 4 test positions of the edge region.

For example, there is an interval region located between the central region and the edge region in the display region, as shown in FIG. 4-4, the determination module 401 for example further includes:

A fifth determination sub-module 4015, configured to determine the interval region located between the central region and the edge region in the display region as a transition region;

A sixth determination sub-module 4016, configured to determine at least one test position in the transition region.

For example, the display region includes at least two test regions, and the at least two test regions include the central region and the edge region; a rotation radius of either test bar satisfies that: an ideal trace obtained by rotation with a point indicated by a first test position as a circle center is within the test region where the first test position is located.

For example, the central region has a length of H/f and a width of V/f; and among the four striped regions constituting the edge region, a width of each of two striped regions is H/f, and a width of each of the other two striped regions is V/f, where f>2;

For example, the testing module 402 is configured to:

Set a shortest edge distance D of the two test bars, the shortest edge distance being greater than or equal to a two-finger minimum touch distance;

Coaxially rotate in a same rotation direction the two test bars respectively located on both sides of the first test position, with the point indicated by the first test position as a circle center, a maximum rotation outer radius R among rotation outer radii of the two test bars satisfying that:

$$R \le \frac{\min[H, V]}{2f};$$

the coaxially rotation in the same rotation direction meaning that at any moment during a rotation procedure, circle centers of bottom surfaces of the two test bars which are in contact with the touch display screen are collinear with the point indicated by the first test position, and rotation directions of the two test bars are the same;

For example, for each of the two test bars, a rotation outer radius of the test bar is equal to a sum of a radius and the rotation radius of the test bar, and min[H,V] represents a minimum value taken between H and V.

For example, f=5.

For example, the display region is a rectangular region, and the display region has a length H and a width V, and the determination module 401 is configured to:

Determine the central position of the display region as 1 test position in the central region;

Set a shortest edge distance D of the two test bars, the shortest edge distance being greater than or equal to a two-finger minimum touch distance;

Determine rotation outer radii of the two test bars according to the shortest edge distance D of the two test bars, the radii of the two test bars and the rotation radii of the two test bars; the rotation outer radius of the test bar is equal to a sum of the radius and the rotation radius of the test bar;

Determine a maximum rotation outer radius among the rotation outer radii of the two test bars to satisfy that:

$$R \le \frac{\min[H, V]}{w},$$

and determine 4 first target circle centers at four corners of the display region, a circle with the first target circle center as a circle center and with $$\frac{\min[H, V]}{w}$$

as a radius being tangent respectively with a long side and a wide side of the display region close to the first target circle center, where w≥3, and min[H,V] represents a minimum value taken between H and V;

Determine positions where the 4 first target circle centers are located as 4 test positions of the edge region.

For example, the determination module 401 is further configured to:

Determine a maximum rotation outer radius among the rotation outer radii of the two test bars to satisfy that:

$$\frac{\min[H, V]}{w} < R \le \frac{\min[H, V]}{2},$$

and determine 4 second target circle centers at the four corners of the display region, a circle with the second target circle center as a circle center and with the maximum rotation outer radius as a radius being tangent respectively with a long side and a broad side of the display region close to the second target circle center;

Determine positions where the 4 second target circle centers are located as 4 test positions of the edge region.

For example, the testing module 402 is configured to:

Coaxially rotate in a same rotation direction the two test bars respectively located on both sides of the first test position, with the point indicated by a first test position as a circle center, the first test position being any test position of the at least two test positions, the coaxially rotation in the same rotation direction meaning that at any moment during a rotation procedure, circle centers of bottom surfaces of the two test bars which are in contact with the touch display screen are collinear with the point indicated by the first test position, and rotation directions of the two test bars are the same;

Obtain a rotation trace acquired by the touch display screen;

Determine whether the rotation performance corresponding to the first test position is qualified or not according to the rotation trace.

For example, either of the two test bars is rotated 360° around the point indicated by the first test position.

Rotation performance of the central region and rotation performance of the edge region of the touch display screen may be greatly different. In the embodiments of the present disclosure, the determination module determines test positions respectively in the central region and the edge region of the display region, and the testing module tests rotation performances of the determined test positions, to ensure that regions whose rotation performances differ more greatly of the touch display screen are tested, and thus to enlarge a coverage scope of the test and to improve accuracy of a test result.

Those skilled in the art can clearly understand that, for convenience and conciseness of description, specific working processes of devices and modules described above, can refer to corresponding processes in the embodiments of the foregoing methods, which will not be repeated here.

It may be understood by those skilled in the art that the whole or part of the steps in the above embodiments may be completed either by hardware, or by program instructing relevant hardware, wherein the program may be stored in a computer-readable storage medium, which may be read-only memory (ROM), magnetic disk, optical disk, etc.

The foregoing embodiments merely are exemplary embodiments of the present disclosure, and not intended to define the scope of the present disclosure, and the scope of the present disclosure is determined by the appended claims.

The present application claims priority of Chinese Patent Application No. 201511025726.1 filed on Dec. 31, 2015, the present disclosure of which is incorporated herein by reference in its entirety as part of the present application.

The invention claimed is:

1. A device for testing a rotation performance of a touch display screen, comprising: a determination module, configured to determine at least two test positions in a display region of the touch display screen, the at least two test positions including at least one test position located in a central region of the display region and at least one test position located in an edge region of the display region; and a testing module, configured to test a rotation performance corresponding to each test position of the at least two test positions, wherein, the display region is a rectangular region, and the display region has a length H and a width V, the determination module, includes: a first determination sub-module, configured to determine a rectangular region including a central position of the display region as the central region, a boundary of the central region and a boundary of the display region being similar patterns; a second determination sub-module, configured to determine at least one test position in the central region; a third determination sub-module, configured to determine an annular region located at the edge of the display region as the edge region, an outer boundary of the edge region coinciding with the boundary of the display region, and an inner boundary of the edge region and the boundary of the display region being similar patterns; a fourth determination sub-module, configured to determine at least one test position in the edge region.

2. The device according to claim 1, wherein,
the display region is a rectangular region, and the display region has a length H and a width V, and
the determination module, is configured to:
determine a central position of the display region as 1 test position in the central region;
set a shortest edge distance of two test bars, the shortest edge distance being greater than or equal to a two-finger minimum touch distance;
determine rotation outer radii of the two test bars according to the shortest edge distance of the two test bars, radii of the two test bars and rotation radii of the two test bars; the rotation outer radius of each test bar is equal to a sum of the radius and the rotation radius of each test bar;
determine a maximum rotation outer radius among the rotation outer radii of the two test bars to satisfy that:

$$R \le \frac{\min[H, V]}{w},$$

and determining 4 first target circle centers at four corners of the display region, a circle with the first target circle center as a circle center and with $$\frac{\min[H, V]}{w}$$

as a radius being tangent respectively with a long side and a wide side of the display region close to the first target circle center, where w≥3, and min[H,V] represents a minimum value between H and V;
determine positions where the 4 first target circle centers are located as 4 test positions of the edge region.

3. The device according to claim 1, wherein, the testing module, is configured to:
coaxially rotate in a same rotation direction two test bars respectively located on both sides of a first test position, with a point indicated by a first test position as a circle center, the first test position being any test position of the at least two test positions, the coaxially rotate in the same rotation direction meaning that at any moment during a rotation procedure, circle centers of bottom surface of the two test bars which are in contact with the touch display screen are collinear with the point indicated by the first test position, and rotation directions of the two test bars are the same;
obtain a rotation trace acquired by the touch display screen;
determine whether the rotation performance corresponding to the first test position is qualified or not according to the rotation trace.

4. A method for testing a rotation performance of a touch display screen, comprising: determining at least two test positions in a display region of the touch display screen, the at least two test positions including at least one test position located in a central region of the display region and at least one test position located in an edge region of the display region; and testing a rotation performance corresponding to each test position of the at least two test positions, wherein, the display region is a rectangular region, and the display region has a length H and a width V, and the determining at least two test positions in the display region of the touch display screen, includes: determining a rectangular region including a central position of the display region as the central region, a boundary of the central region and a boundary of the display region being similar patterns; determining at least one test position in the central region; determining an annular region located at the edge of the display region as the edge region, an outer boundary of the edge region coinciding with the boundary of the display region, and an inner boundary of the edge region and the boundary of the display region being similar patterns; and determining at least one test position in the edge region.

5. The method according to claim 4, wherein, the determining at least one test position in the central region, includes: determining the central position of the display region as 1 test position in the central region.

6. The method according to claim 4, wherein, the determining at least one test position in the edge region, includes: determining a first rectangular scanning line, the first rectangular scanning line being a closed rectangular line formed by a central axis of each striped region of four striped regions constituting the edge region; taking positions where four vertexes of the first rectangular scanning line are located as 4 test positions of the edge region.

7. The method according to claim 6, wherein,
the determining at least one test position in the edge region, further includes:
taking positions where midpoints between every two adjacent vertexes among the four vertexes of the first rectangular scanning line are located as another 4 test positions of the edge region.

8. The method according to claim 4, wherein the method further comprises: dividing the display region into n.times.n rectangular sub-regions, a boundary of each of the rectangular sub-regions and the boundary of the display region being similar patterns, and n being an odd number greater than 2; the determining the rectangular region including the central position of the display region as the central region, includes: determining a region constituted by the rectangular sub-region located at the center of the display region as the central region; and the determining the annular region located at the edge of the display region as the edge region, includes: determining a region constituted by 4.times.(n−1) rectangular sub-regions located at the edge of the display region as the edge region, the 4.times.(n−1) rectangular sub-regions constituting the annular region.

9. The method according to claim 8, wherein,
the determining at least one test position in the central region, includes: determining a central position of the central region as 1 test position in the central region;
the determining at least one test position in the edge region, includes: determining central positions of the 4 rectangular sub-regions located at four corners of the edge region as 4 test positions of the edge region.

10. The method according to claim 4, wherein, there is an interval region located between the central region and the edge region in the display region, and the determining at least two test positions in the display region of the touch display screen, further includes: determining the interval region located between the central region and the edge region in the display region as a transition region; determining at least one test position in the transition region.

11. The method according to claim 4, wherein, the display region includes at least two test regions, the at least two test regions include the central region and the edge region; a rotation radius of a test bar satisfies that: an ideal trace of the test bar obtained by rotation with a point indicated by a first test position as a circle center is within the test region where the first test position is located, and the first test position is any test position in the at least two test positions.

12. The method according to claim 11, wherein,
the central region has a length of H/f and a width of V/f; and among the four striped regions constituting the edge region, a width of each of two striped regions is H/f, and a width of each of the other two striped regions is V/f, where f>2;
the testing the rotation performance corresponding to each test position of the at least two test positions, includes:
setting a shortest edge distance of two test bars, the shortest edge distance being greater than or equal to a two-finger minimum touch distance;
coaxially rotating in a same rotation direction the two test bars respectively located on both sides of the first test position, with the point indicated by the first test position as a circle center, a maximum rotation outer radius R among rotation outer radii of the two test bars satisfying that:

$$R \leq \frac{\min[H, V]}{2f};$$

the coaxially rotating in the same rotation direction meaning that at any moment during a rotation procedure, circle centers of bottom surfaces of the two test bars which are in contact with the touch display screen are collinear with the point indicated by the first test position, and rotation directions of the two test bars are the same;
where, for each of the two test bars, the rotation outer radius of the test bar is equal to a sum of a radius and the rotation radius of the test bar, and min[H,V] represents a minimum value between H and V.

13. The method according to claim 12, wherein, f=5.

14. The method according to claim 4, wherein,
the display region is a rectangular region, and the display region has a length H and a width V,
the determining at least two test positions in the display region of the touch display screen, includes:
determining a central position of the display region as 1 test position in the central region;
setting a shortest edge distance of two test bars, the shortest edge distance being greater than or equal to a two-finger minimum touch distance;
determining rotation outer radii of the two test bars according to the shortest edge distance of the two test bars, radii of the two test bars and rotation radii of the two test bars; the rotation outer radius of each test bar is equal to a sum of the radius and the rotation radius of each test bar;
determining a maximum rotation outer radius among the rotation outer radii of the two test bars to satisfy that:

$$R \leq \frac{\min[H, V]}{w},$$

and determining 4 first target circle centers at four corners of the display region, a circle with the first target circle center as a circle center and with $$\frac{\min[H, V]}{w}$$

as a radius being tangent respectively with a long side and a wide side of the display region close to the first target circle center, where w≥3, and min[H,V] represents a minimum value between H and V;
determining positions where the 4 first target circle centers are located as 4 test positions of the edge region.

15. The method according to claim 14, wherein,
the determining at least two test positions in the display region of the touch display screen, further includes:
determining the maximum rotation outer radius R among the rotation outer radii of the two test bars to satisfy that:

$$\frac{\min[H, V]}{w} < R \leq \frac{\min[H, V]}{2},$$

and determining 4 second target circle centers at the four corners of the display region, a circle with the second target circle center as the circle center and with the maximum rotation outer radius as the radius being tangent respectively with the long side and the wide side of the display region close to the second target circle center;
determining positions where the 4 second target circle centers are located as 4 test positions of the edge region.

16. The method according to claim 4, wherein,
the testing the rotation performance corresponding to each test position of the at least two test positions, includes:
coaxially rotating in a same rotation direction two test bars respectively located on both sides of a first test position, with a point indicated by a first test position as a circle center, the first test position being any test position of the at least two test positions, the coaxially rotating in the same rotation direction meaning that at any moment during a rotation procedure, circle centers of bottom surface of the two test bars which are in contact with the touch display screen are collinear with the point indicated by the first test position, and rotation directions of the two test bars are the same;
obtaining a rotation trace acquired by the touch display screen;
determining whether the rotation performance corresponding to the first test position is qualified or not according to the rotation trace.

17. The method according to claim 16, wherein, either of the two test bars is rotated by 360° around the point indicated by the first test position.

* * * * *